(12) United States Patent
Ryu et al.

(10) Patent No.: US 9,743,559 B2
(45) Date of Patent: Aug. 22, 2017

(54) APPARATUS AND METHOD FOR COOLING SERVER ROOM USING OUTSIDE AIR

(71) Applicant: NHN Business Platform Corp., Seongnam-si, Kyunggi-do (KR)

(72) Inventors: Keunho Ryu, Seongnam-si (KR); Yong Soo Youn, Seongnam-si (KR)

(73) Assignee: NHN Business Platform Corp., Seongnam-si (KR)

( * ) Notice: Subject to any disclaimer, the term of this patent is extended or adjusted under 35 U.S.C. 154(b) by 610 days.

(21) Appl. No.: 13/974,475

(22) Filed: Aug. 23, 2013

(65) Prior Publication Data

US 2014/0170951 A1 Jun. 19, 2014

(30) Foreign Application Priority Data

Oct. 30, 2012 (KR) .................. 10-2012-0120913

(51) Int. Cl.
*H05K 5/00* (2006.01)
*H05K 7/20* (2006.01)

(52) U.S. Cl.
CPC .............. *H05K 7/20745* (2013.01)

(58) Field of Classification Search
CPC ................................... H05K 7/20745
USPC .......................................... 454/184
See application file for complete search history.

(56) References Cited

U.S. PATENT DOCUMENTS

| | | | | |
|---|---|---|---|---|
| 1,887,938 A * | 11/1932 | Lewis | ................ | F24F 3/044 165/48.1 |
| 2,118,949 A * | 5/1938 | Scott | ................ | F24F 5/0007 165/48.1 |
| 2,256,940 A * | 9/1941 | Crawford | ................ | F24F 3/1417 261/158 |
| 3,997,635 A * | 12/1976 | Hallgren | ................ | F28C 1/14 261/112.1 |
| 4,662,899 A * | 5/1987 | Tandon | ................ | B01D 46/18 165/909 |
| 4,719,761 A * | 1/1988 | Cromer | ................ | F24F 3/1405 62/271 |
| 4,910,971 A * | 3/1990 | McNab | ................ | F24F 3/044 62/310 |
| 5,392,611 A * | 2/1995 | Assaf | ................ | A01G 9/246 237/81 |

(Continued)

FOREIGN PATENT DOCUMENTS

| JP | 2001-193979 | 7/2001 |
|---|---|---|
| JP | 2008-518432 A | 5/2008 |

(Continued)

OTHER PUBLICATIONS

Japanese Office Action dated Mar. 17, 2015 issued in corresponding Japanese Application No. 2013-152220.

(Continued)

*Primary Examiner* — Steven B McAllister
*Assistant Examiner* — Jonathan Cotov
(74) *Attorney, Agent, or Firm* — Harness, Dickey & Pierce, P.L.C.

(57) ABSTRACT

Provided is a server room cooling apparatus and method using natural air. The server room cooling apparatus includes an inlet part to take in outside air, a spray part to spray mist on the outside air that is taken in, and a supplying part to supply the outside air on which the mist is sprayed to the inside of a server room.

20 Claims, 7 Drawing Sheets

(56) References Cited

U.S. PATENT DOCUMENTS

| | | | | |
|---|---|---|---|---|
| 5,718,628 | A * | 2/1998 | Nakazato | F24F 3/044 236/49.5 |
| 5,806,762 | A * | 9/1998 | Herr | B05B 1/3006 236/1 E |
| 6,141,986 | A * | 11/2000 | Koplin | F24F 5/0035 62/304 |
| 6,374,627 | B1 * | 4/2002 | Schumacher | G06F 1/20 165/104.33 |
| 7,500,911 | B2 * | 3/2009 | Johnson | H05K 7/20736 165/104.33 |
| 8,286,442 | B2 * | 10/2012 | Carlson | F24F 11/0001 62/259.2 |
| 2004/0031282 | A1 * | 2/2004 | Kopko | F24F 3/1417 62/271 |
| 2007/0012188 | A1 * | 1/2007 | Tandon | B01D 46/0036 95/273 |
| 2008/0029250 | A1 * | 2/2008 | Carlson | F24F 11/0001 165/104.33 |
| 2010/0130117 | A1 * | 5/2010 | Larsen | F24F 11/0001 454/184 |
| 2010/0248609 | A1 * | 9/2010 | Tresh | H05K 7/20745 454/184 |
| 2011/0175498 | A1 * | 7/2011 | Bash | F24F 11/0001 312/107 |
| 2011/0239683 | A1 * | 10/2011 | Czamara | H05K 7/20745 62/259.4 |
| 2011/0256822 | A1 * | 10/2011 | Carlson | H05K 7/20827 454/184 |
| 2012/0083196 | A1 * | 4/2012 | Mockridge | F24F 11/0001 454/184 |
| 2012/0171943 | A1 * | 7/2012 | Dunnavant | H05K 7/20745 454/184 |
| 2012/0298334 | A1 * | 11/2012 | Madaffari | H05K 7/20745 165/104.13 |

FOREIGN PATENT DOCUMENTS

| | | |
|---|---|---|
| JP | 2009-110469 | 5/2009 |
| JP | 2010-025377 | 2/2010 |
| JP | 2010-541238 A | 12/2010 |
| JP | 2011-242010 A | 12/2011 |
| JP | 2012-037086 | 2/2012 |
| KR | 20110069972 A | 6/2011 |

OTHER PUBLICATIONS

Japanese Office Action dated Jul. 15, 2014 issued in corresponding Japanese Application No. 2013-152220.
Korean Office Action dated May 31, 2014 issued in corresponding Korean Application No. 10-2012-0120913.

* cited by examiner

APPARATUS AND METHOD FOR COOLING SERVER ROOM USING OUTSIDE AIR

CROSS-REFERENCE TO RELATED APPLICATION

This application claims priority from and the benefit of Korean Patent Application No. 10-2012-0120913, filed on Oct. 30, 2012, which is hereby incorporated by reference for all purposes as if fully set forth herein.

BACKGROUND

Field

Example embodiments relate to a server room cooling apparatus and method using naturally occurring air, e.g. natural air to cool a server room.

Discussion of the Background

A server, a network device, an enterprise device, and similar devices included in a data center generate heat. Therefore, large facilities for cooling the generated heat may also be operated in the data center that operates such devices.

To cool the generated heat of the data center, providing cooler air to each device is required. For this, in general, a thermostat that generates cooler air is used.

However, energy consumed for operating the thermostat and facilities connected with the thermostat correspond to 50 through 60% of a total amount of power consumed in the data center.

Therefore, to reduce an amount of energy consumed by cooling the data center, a scheme that brings, into a server room, a cooler air from the outside of a building, e.g. naturally occurring cool air, and cools the heat of the device has been employed.

In this regard, Korean patent publication No. 10-2011-0069972 (date of the publication: Jun. 24, 2011), titled Cooling controlling apparatus and its method of internet data center, discloses comparing temperatures between inside air and outside air of the data center, performing a control operation so that the inside air is exhausted to the outside, and simultaneously, outside air flows into the data center when the temperature of the outside air is lower than the temperature of the inside air, and performing a control operation so that the inside air is cooled through a cooling element and flows into the inside of the data center, and simultaneously, an inflow of the outside air is blocked when the temperature of the outside air is higher than or equal to the temperature of the inside air.

However, the conventional cooling system does not provide sufficient improvement in reducing an amount of energy expended because a short period of time is allowed for cooling the data center using the outside air due to a characteristic requiring the data center to be perpetually or continuously operational and a large amount of air, and the system has a difficulty in maintaining an appropriate temperature or adjusting the humidity of the data center during a cooling process using outside air.

Also, due to an inflow of contaminant or pollutants, e.g., dust included in the outside air and the like, an error may occur in a device included in the data center.

SUMMARY

Example embodiments provide a server room cooling apparatus and method using natural air, which may increase a period for cooling a data center using outside air.

Example embodiments provide a server room cooling apparatus and method using natural air, which may maintain a moderate temperature and humidity in a data center when the data center is cooled using outside air.

Example embodiments provide a server room cooling apparatus and method using natural air, which may more effectively block a foreign substance included in outside air, and may reduce maintenance costs.

Example embodiments provide a server room cooling apparatus and method using natural air, which may be appropriate for an environment that varies based on a temperature and/or humidity of outside air.

Example embodiments provide a server room cooling apparatus and method using natural air, which may effectively deal with problem occurring during a cooling process using outside air.

Example embodiments provide a server room cooling apparatus and method using natural air, which may reduce an amount of energy expended for cooling a data center.

Additional features of the example embodiments will be set forth in the description which follows, and in part will be apparent from the description, or may be learned by practice of the example embodiments.

An example embodiment discloses a server room cooling apparatus, the apparatus including an inlet part to take in outside air, a spray part to spray a mist on the outside air taken in, and a supplying part to supply, to the inside of a server room, the outside air on which the mist is sprayed.

The inlet includes a dual filter that blocks a foreign substance or contaminant or pollutants, included in the outside air, and is automatically replaced based on a pollution level.

The supplying part is provided in a lower portion of the server room, and supplies the outside air on which the mist is sprayed to a server rack included in the server room.

The server room cooling apparatus further includes a measuring part to measure a temperature and humidity of the outside air taken in.

The server room cooling apparatus further includes a controller to adjust an amount of the mist sprayed, so as to cool or to humidify the outside air taken in, based on the measured temperature and humidity of the outside air.

The controller adjusts, based on a constant enthalpy line, an amount of the mist sprayed, so as to lower the temperature of the outside air taken in.

The controller adjusts, based on a constant temperature line, an amount of the mist sprayed, so as to raise the humidity of the outside air taken in.

The apparatus further includes a constant temperature part to take in air from the inside of the server room and to cool the air, and the controller operates the constant temperature part based on the measured temperature and humidity of the outside air, so as to cool the air of the inside of the server room.

The apparatus further includes an intake part to take in air from the inside of the server room, and the spray part sprays mist on outside air that is mixed with the air taken in.

The apparatus further includes an exhaust part provided in an upper portion of the server room and exhausts air from the inside of the server room.

The exhaust part includes a baffle provided on an upper side of a server rack included in the server room so as to reduce or prevent an air vortex.

Another example embodiment discloses a method for a server room cooling apparatus to cool a server room, the method including taking in outside air, spraying mist on the outside air taken in, and supplying the outside air on which the mist is sprayed to the inside of the server room.

It is to be understood that both the foregoing general description and the following detailed description are explanatory and are intended to provide further explanation of the example embodiments as claimed.

Effect of Example Embodiments

According to example embodiments, a server room cooling method and apparatus may be perpetually or continuously operational in an environment that varies based on a temperature and/or humidity, by supplying, to an inside of a server room, cooler air obtained by spraying a mist on outside air taken in from the outside of a building.

According to example embodiments, a server room cooling method and apparatus may maintain a moderate temperature and humidity by adjusting an amount of the mist sprayed, based on a constant enthalpy line or a constant temperature line, even when a server room is cooled using outside air.

According to example embodiments, a server room cooling method and apparatus may effectively block a foreign substance and may reduce costs for maintenance by blocking a foreign substance included in outside air using a dual filter which is automatically replaced based on a pollution level.

According to example embodiments, a server room cooling method and apparatus may measure temperature and humidity of outside air taken in from the outside of a building, may perform a control operation so as to adjust an amount of the mist sprayed, based on the measured temperature and humidity and thus, may improve or optimally operate in an environment that varies based on a temperature and/or humidity of outside air.

According to example embodiments, a server room cooling method and apparatus may operate in parallel with a thermostat that takes in air from the inside of a server room and cools the air based on a condition of outside air and thus, may reduce or minimize an effect on an entire operation environment even when one of the devices malfunctions.

According to example embodiments, a server room cooling method and apparatus may perpetually or continuously operate and thus, may reduce an amount of energy consumed for cooling a data center.

BRIEF DESCRIPTION OF THE DRAWINGS

The accompanying drawings, which are included to provide a further understanding of the example embodiments and are incorporated in and constitute a part of this specification, illustrate example embodiments, and together with the description serve to explain the principles of the example embodiments.

DETAILED DESCRIPTION OF EXAMPLE EMBODIMENTS

The invention is described more fully hereinafter with reference to the accompanying drawings, in which example embodiments are shown. This invention may, however, be embodied in many different forms and should not be construed as limited to the example embodiments set forth herein. Rather, these example embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

Example embodiments will now be described more fully with reference to the accompanying drawings in which example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
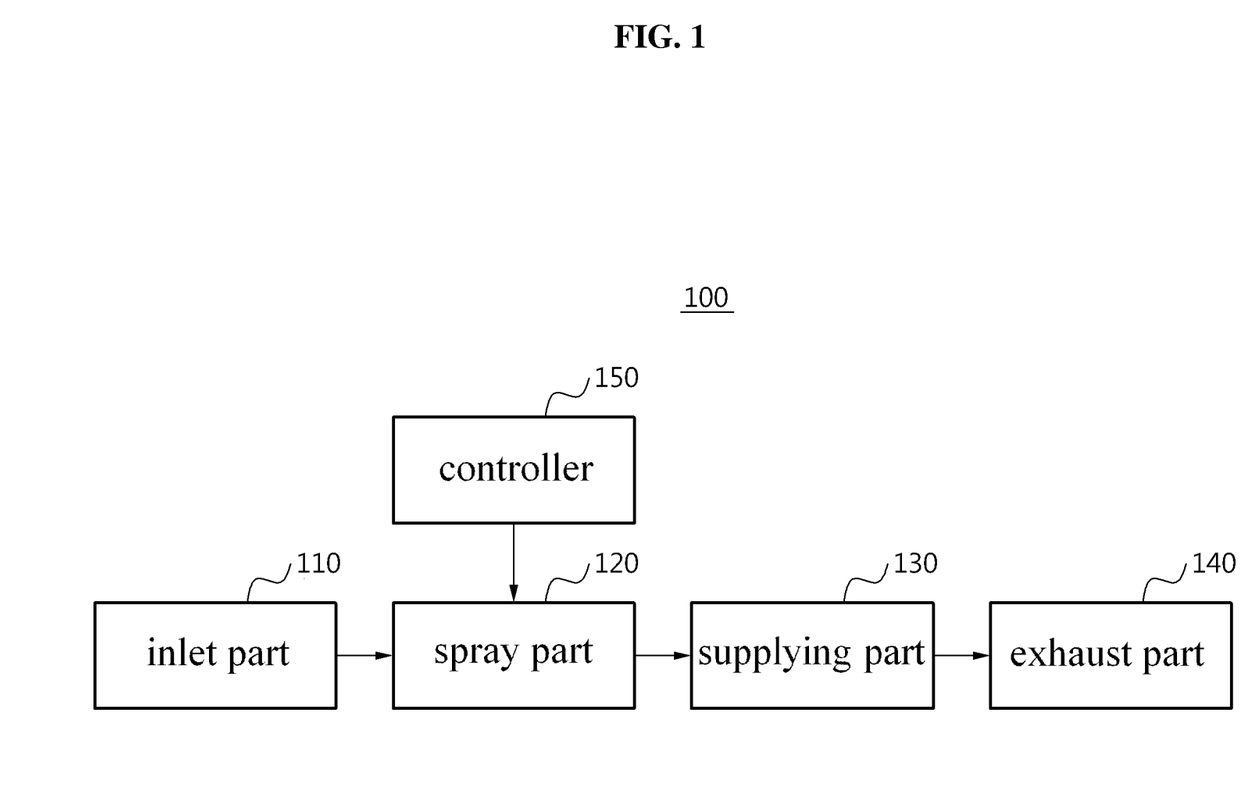
FIG. 1 is a block diagram illustrating a server room cooling apparatus using natural air according to an example embodiment.

FIG. 1 is a block diagram illustrating a server room cooling apparatus using natural air according to an example embodiment.

The server room cooling apparatus using natural air according to example embodiments supplies cooler air to a location that needs to be cooled such as a data center, and may perpetually or continuously cool the inside of the server room using outside air (for example, the outside of a building) at a lower cost even in an environment that varies based on a temperature and/or humidity.

A server room cooling apparatus 100 may include an inlet part 110, a spray part 120, a supplying part 130, an exhaust part, and/or a controller 150.

The inlet part 110 takes in air (hereinafter referred to as outside air) from the outside of a server room (for example, the outside of a building). Generally, a foreign substance such as dust is included in outside air. The foreign substance may cause an error in a server, a network device, an enterprise device, and similar devices included in the server room. To reduce or prevent this, the inlet 110 may include a filter that blocks a foreign substance included in outside air taken in from the outside of the server room.

The filter may be embodied as a dual-filter to more effectively remove a foreign substance included in outside air. The dual-filter may include, for example, a pre-processing filter that primarily blocks a foreign substance included in outside air and a roll filter that is automatically replaced based on a contamination level of the filter.

The spray part 120 sprays minute particles of water, that is, a mist, on outside air taken in through the inlet 110 using a nozzle so that a temperature and humidity of the inside of the server room is maintained to have a moderate condition. By way of example, the spray part 120 sprays the mist on outside air, and raises a lower humidity which is a characteristic of the outside air and lowers a temperature, so that a condition of air in the inside of the server room is maintained to be appropriate for operating a device.

The supplying part 130 supplies, to the inside of the server room, outside air cooled by the spray part 120. The supplying part 130 may include a fan to feed, into the inside of the server room, the outside air cooled by the mist.

As a general principle, warmer air rises. Accordingly, the supplying part 130 may be provided in a lower portion of the server room, and supplies outside air on which the mist is sprayed to a server rack included in the server room.

The exhaust part 140 is provided in an upper portion of the server room, and exhausts air from the inside of the server room. The exhaust part 140 may be embodied as a duct. When cooler air supplied from a lower portion of the server room is heated by the server rack included in the server room and rises to an upper portion of the server room, the exhaust part 140 takes in the air and exhausts the air out of the server room. In this example, an air vortex may occur in the upper portion of the server room and thus, the exhaust part 140 may reduce or prevent an air vortex using a baffle provided in an upper side of the server rack.

Although not illustrated in FIG. 1, on one side of the server room cooling apparatus 100, a measuring part that measures a temperature and humidity of outside air taken in through the inlet part 110 may be included. The measuring part may include, for example, a temperature sensor that measures a temperature and humidity sensor that measures humidity. Information associated with the measured temperature and humidity of the outside air may be transmitted to the controller 150.

The controller 150 adjusts an amount of the mist sprayed from the spray part 120 based on the information associated with the temperature and humidity received from the measuring part so that the outside air taken in is cooled or humidified and the outside air has a moderate temperature/humidity. The controller 150 may be embodied as a remote control device capable of remotely controlling the server room cooling apparatus 100.

For example, the controller 150 may adjust, based on a constant enthalpy line, an amount of the mist sprayed, so as to lower a temperature of outside air, when it is determined that the inside of the server room needs to be cooled by comparing information associated with a temperature and humidity of the inside of the server room and information associated with a temperature and humidity of the outside air. However, the controller 150 may adjust, based on a constant temperature line, an amount of the mist sprayed, so as to raise the humidity of outside air supplied to the inside of the server room when the inside of the server room has a moderate temperature but needs to be humidified.

Although not illustrated, the server room cooling apparatus 100 may further include a constant temperature part that takes in air from the inside of the server room and cools the air. The constant temperature part may be embodied as an air conditioning device such as a thermostat, a humidistat, and the like. In this example, the controller 150 controls the server room cooling apparatus 100 to be solely operated based on a temperature and humidity of outside air, or to be operated in parallel with a thermostat, a humidistat, and the like so as to reduce or minimize an effect on an entire operation environment when one of the devices malfunctions.

Also, the server room cooling apparatus 100 may further include an intake part that takes in air from the inside of the server room. The intake part may take in air from the inside of the server room based on a control of the controller 150, and may feed the air into the server room cooling apparatus 100 so that outside air is mixed with the air of the inside of the server room. In this example, the spray part 120 sprays mist on the mixed air so that the server room is effectively cooled or humidified.

Figure 2:
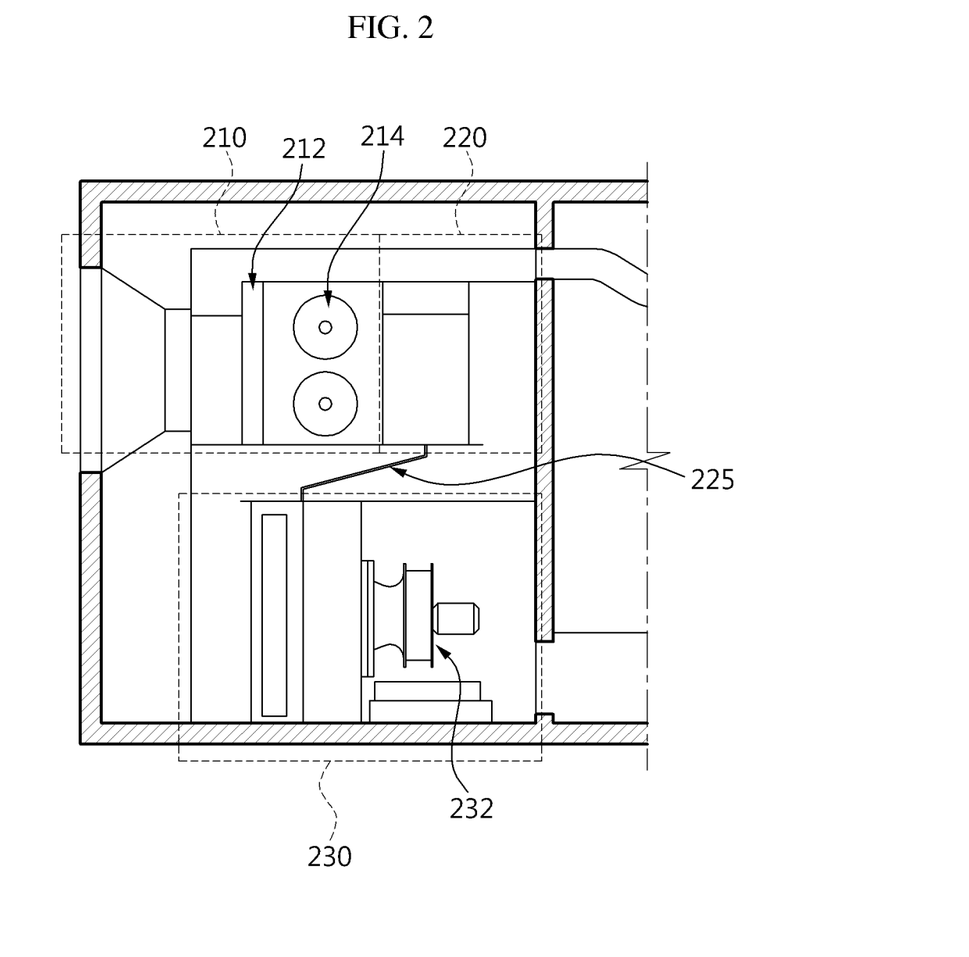
FIG. 2 is a diagram illustrating a detailed configuration of a server room cooling apparatus using natural air according to an example embodiment.

FIG. 2 is a diagram illustrating a detailed configuration of a server room cooling apparatus using natural air according to an example embodiment. Hereinafter, the configuration of the server room cooling apparatus 200 will be described in detail with reference to FIG. 2.

An inlet 210 takes in outside air from the outside of a server room, and blocks a foreign substance included in the outside air, such as dust, using a pre-processing filter 212 and a roll-filter 214, as illustrated in FIG. 2.

The outside air taken in through the inlet part 210 flows into a spray part 220. The spray part 220 sprays the mist on the outside air taken in through the inlet part 210, using a nozzle so as to maintain a temperature and humidity of the inside of the server room to be under moderate conditions. By way of example, the spray part 220 sprays the mist on the outside air, and raises a low humidity which is a characteristic of the outside air and lowers a temperature, so that a condition of air in the inside of the server room is maintained to be appropriate for operating a device.

An inlet 210 takes in outside air from the outside of a server room, and blocks a foreign substance included in the outside air, such as dust, using a dual filter. The dual filter may include a pre-processing filter 212 and a roll-filter 214, as illustrated in FIG. 2.

In this example, as a general principle, warmer air rises and cooler air falls and thus, the outside air cooled or humidified may be supplied to the lower portion of the server room through the supplying part 230 included in a lower side of the server room cooling apparatus 200.

Although not illustrated in FIG. 2, on one side of the server room cooling apparatus, a measuring part that measures a temperature and humidity of outside air taken in through the inlet part 210 may be included. The measuring part may include, for example, a temperature sensor that measures temperature and/or a humidity sensor that measures humidity. Information associated with the measured temperature and humidity of the outside air may be transmitted to a controller (not illustrated). The controller may adjust an amount of the mist sprayed from the spray part 220 based on the information associated with the temperature and humidity received from the measuring part so that the outside air taken in has more moderate temperature and/or humidity.

For example, the controller may adjust, based on a constant enthalpy line, an amount of the mist sprayed so as to lower a temperature of outside air when a measured temperature of the outside air is higher than or equal to a predetermined (or desired) value and it is determined that the inside of the server room needs to be cooled, and the controller may adjust, based on a constant temperature line, an amount of the mist sprayed so as to raise the humidity of outside air supplied to the inside of the server room without a change in a temperature of the outside air when the temperature of the outside air is moderate but a measured humidity of the outside air is lower than or equal to a predetermined (or desired) value and it is determined that the inside of the server room needs to be humidified.

The sever room cooling apparatus 200 according to the example embodiments may be built to fit the size of the server room, and may reduce an annual operating cost since it may be in perpetual or continuous operation.

Figure 3:
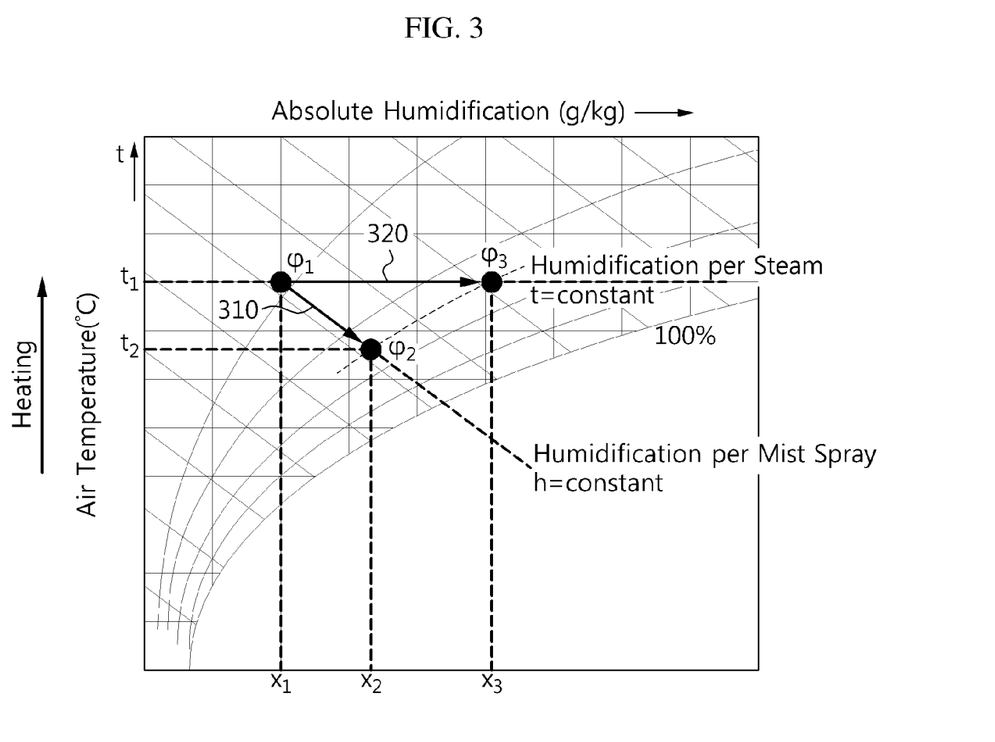
FIG. 3 is a graph illustrating a method of adjusting an amount of a mist sprayed according to an example embodiment.

FIG. 3 is a graph illustrating a method of adjusting an amount of mist sprayed according to an example embodiment. FIG. 3 illustrates a relationship between temperature and humidity.

A controller of a server room cooling apparatus according to example embodiments may adjust an amount of the mist sprayed, based on information associated with a temperature and humidity. For example, the controller may lower a temperature of outside air without a change in humidity of the outside air by adjusting an amount of mist sprayed, based on a constant enthalpy line from φ1 to φ2, in the summer season when the temperature and humidity of outside air are high. Also, the controller may lower the humidity of outside air without a change in a temperature of the outside air by adjusting an amount of mist sprayed, based on a constant temperature line from φ1 to φ3, in winter when the temperature and humidity of outside air are low.

By way of example, when both temperature and humidity of the inside of a server room are low, the server room cooling apparatus according to example embodiments may adjust an amount of mist sprayed so as to increase only the humidity of the inside of the server room. When both a temperature and the humidity of the inside of the server room are high, the apparatus may adjust an amount of mist sprayed so as to decrease only the temperature of the inside of the server room.

Figure 4:
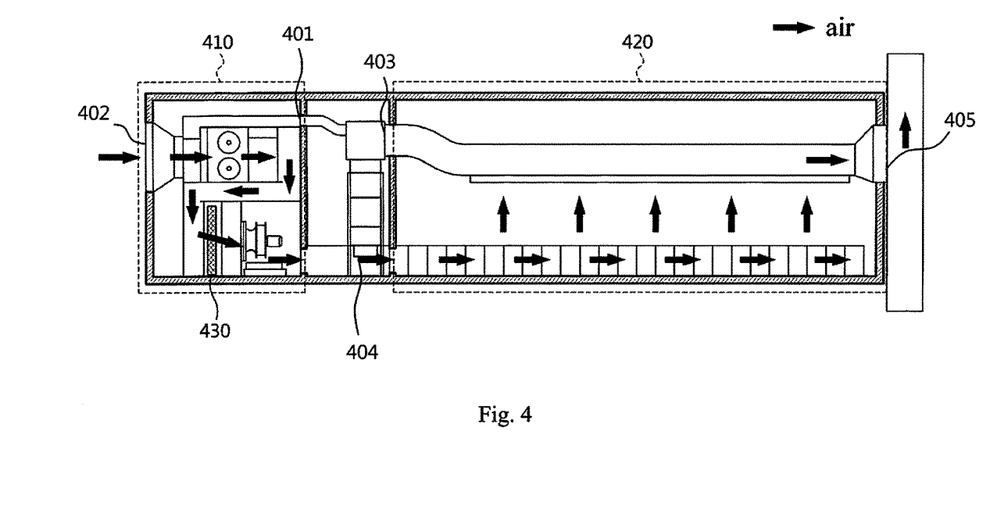
FIG. 4 is a diagram illustrating a process of cooling the inside of a server room using outside air according to an example embodiment.

FIG. 4 is a diagram illustrating a process of cooling the inside of a server room using outside air according to example embodiments. Although FIG. 4 illustrates that a server room cooling apparatus 410 is provided on each floor of a building, a single server room cooling apparatus may supply outside air to a server room 420 on each floor.

As illustrated in FIG. 4, the server room cooling apparatus 410 is provided outside of the server room 420, and may cool air outside of the server room 420 and supply the outside air to the inside of the server room 420.

The outside air outside of the server room flows into the inside of the server room cooling apparatus 410 through an inlet part of the server room cooling apparatus 410. In this example, a foreign substance included in the outside air may be blocked through a dual-field. The outside air of which a foreign substance is blocked flows into a spray part of the server room cooling apparatus 410 and is cooled or humidified by the mist sprayed from the spray part. Subsequently, the cooled or humidified outside air flows into a supplying part included in a lower side of the server room cooling apparatus 410 and is supplied to a lower portion of the server room 420 through a fan included in the supplying part.

The cooler air supplied to the lower portion of the server room 420 flows into a server rack included in the server room 420, and is heated by a plurality of servers included in the server rack, and exhausted from the server room 420 through a duct included on an upper side of the server room 420.

The outside air outside of the server room flows into the inside of the server room cooling apparatus 410 through an inlet part of the server room cooling apparatus 410. In this example, a foreign substance included in the outside air may be blocked through a dual-filter. The outside air of which a foreign substance is blocked flows into a spray part of the server room cooling apparatus 410 and is cooled or humidified by the mist sprayed from the spray part. Subsequently, the cooled or humidified outside air flows into a supplying part included in a lower side of the server room cooling apparatus 410 and is supplied to a lower portion of the server room 420 through a fan included hi the supplying part.

For example, an intake part, an inlet part, a constant temperature part, and an exhaust part of the server room cooling apparatus 410 may include a vibration motor or a motor damper that is automatically opened and closed by air pressure.

When it is assumed that a motor damper that adjusts an amount of inside air of the server room 420 which is taken into the inside of the server room cooling apparatus 410 is referred to as a first motor damper, a motor damper included in the inlet part and adjusts an amount of outside air taken into the inside of the server room cooling apparatus 410 is referred to as a second motor damper, a motor damper included in the exhaust part and adjusts an amount of inside air of the server room 420 which is taken into the constant temperature part is referred to as a third motor damper, a motor damper included in the constant temperature part and adjusts an amount of air supplied from the constant temperature part is referred to as a fourth motor damper, and a motor damper included in the exhaust part and adjusts an amount of inside air exhausted out of the server room 420 is referred to as a fifth motor damper, the server room cooling apparatus 410 closes the first, the second, and the fifth motor dampers and opens the third and fourth motor dampers during operation of a thermostat so that circulation-cooling of inside air of the server room 420 is more effectively performed.

Also, the server room cooling apparatus 410 closes the first, the third, and the fourth motor dampers and opens the second and the fifth motor dampers during outside air intake operation, so that outside air taken in through the inlet part, and cooled or humidified through the spray part, may pass through the server room 420 and may be exhausted through the exhaust part. Accordingly, the inside of the server room 420 may be effectively cooled by the cooled or humidified outside air. For example, the outside air intake operation may be performed when a temperature of outside air is lower than or equal to 26 degrees C.°.

When it is assumed that a motor damper that adjusts an amount of inside air of the server room 420 which is taken into the inside of the server room cooling apparatus 410 is referred to as a first motor damper 401, a motor damper included in the inlet part and adjusts an amount of outside air taken into the inside of the server room cooling apparatus 410 is referred to as a second motor damper 402, a motor damper included in the exhaust part and adjusts an amount of inside air of the server room 420 which is taken into the constant temperature part is referred to as a third motor damper 403, a motor damper included in the constant temperature part and adjusts an amount of air supplied from the constant temperature part is referred to as a fourth motor damper 404, and a motor damper included in the exhaust part and adjusts an amount of inside air exhausted out of the server room 420 is referred to as a fifth motor damper 405, the server room cooling apparatus 410 closes the first, the second, and the fifth motor dampers 401, 402, 405 and opens the third and fourth motor dampers 404, 405 during operation of a thermostat so that circulation-cooling of inside air of the server room 420 is more effectively performed.

Also, the server room cooling apparatus 410 closes the first, the third, and the fourth motor dampers 401, 403, 404 and opens the second and the fifth motor dampers 402, 405 during outside air intake operation, so that outside air taken in through the inlet part, and cooled or humidified through the spray part, may pass through the server room 420 and may be exhausted through the exhaust part. Accordingly, the inside of the server room 420 may be effectively cooled by the cooled or humidified outside air. For example, the outside air intake operation may be performed when a temperature of outside air is lower than or equal to 26 degrees C.°.

Also, the server room cooling apparatus 410 opens the first through third motor dampers 401 to 403 and the fifth motor damper 405 and closes the fourth motor damper 404 during operation in winter, so that a temperature of the inside of the server room 420 is maintained to be a predetermined (or desired) level. In this example, the server room cooling apparatus 410 maintains the temperature of the inside of the server room to be lower than or equal to 35 degrees C.°.

Figure 5:
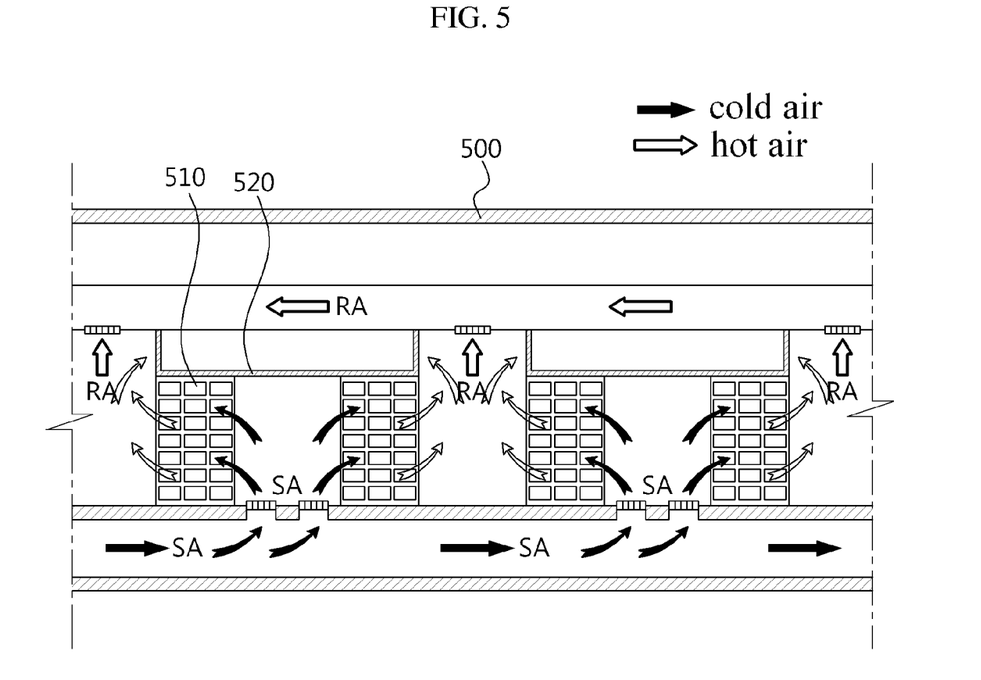
FIG. 5 is a diagram illustrating a flow of air in the inside of a server room according to an example embodiment.

The cooler air supplied to the lower portion of the server room 500 (SA: Supply Air) is supplied to each server rack 510 through a cooler aisle. Warmer air exhausted from the server rack 510 (RA: Return Air) flows into a duct included in an upper portion of the server room 500 through a hot aisle. The air that flows into the duct may flow into the server room cooling apparatus or may be exhausted out of the server room 500.

In this example, an air vortex occurs in the upper portion of the server room 500 and thus, cooler air supplied from the server room cooling apparatus and a warmer air exhausted from the server may be mixed. To reduce or prevent the mix of the cooler air and the warmer air, a baffle 520 may be provided in the upper portion of the server room 500, as illustrated in FIG. 5.

Figure 6:
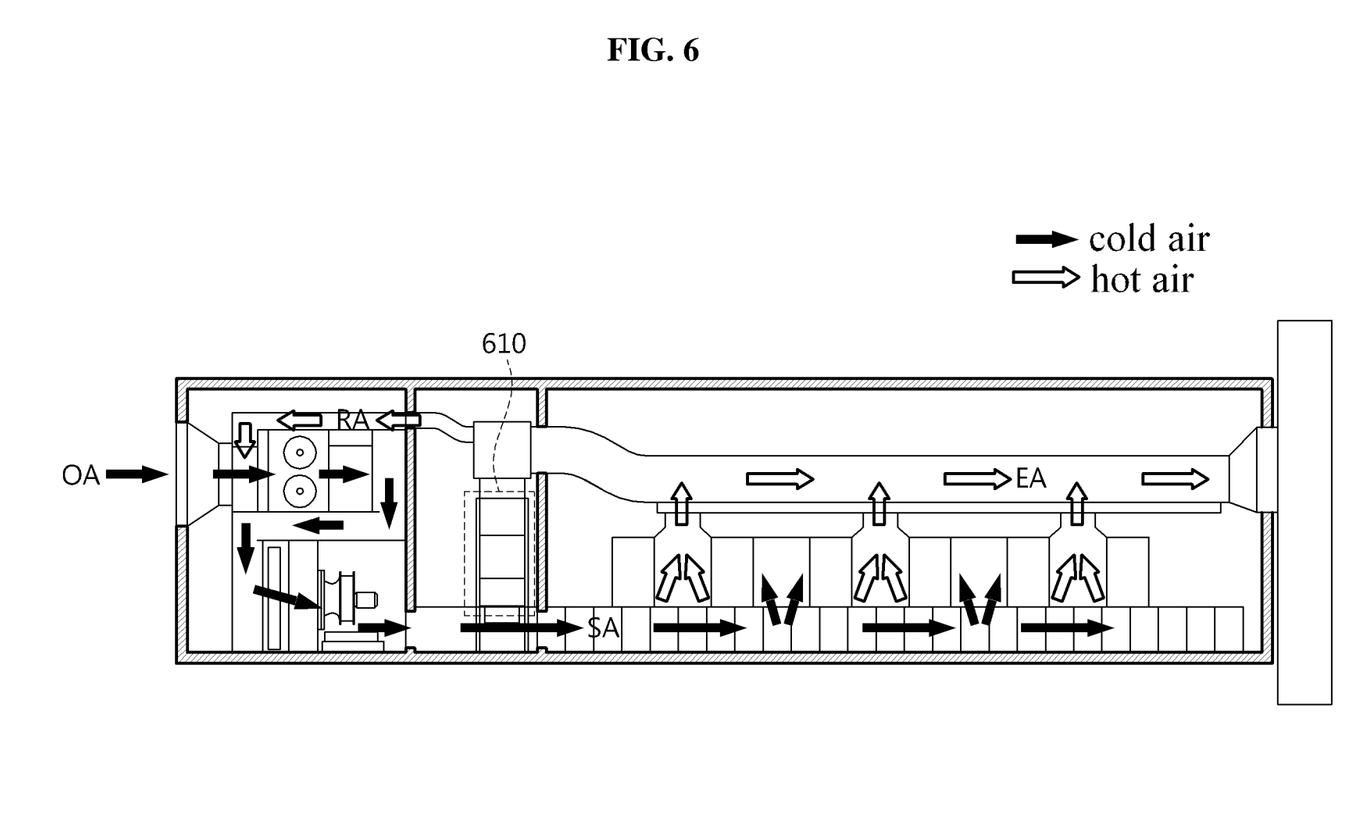
FIG. 6 is a diagram illustrating a cooling process for a case in which a server room cooling apparatus operates in parallel with a thermostat according to an example embodiment.

FIG. 6 is a diagram illustrating a cooling process in the case where a server room cooling apparatus operates in parallel with a thermostat according to example embodiments.

As illustrated in FIG. 6, the server room cooling apparatus may include a thermostat 610 that takes in air from the inside of a server room and cools the air. The thermostat 610 may operate based on a temperature and humidity of outside air.

For example, when a temperature of outside air is between 25 degrees C.° and 29 degrees C.° during the summer season, the server room cooling apparatus takes in outside air, sprays mist so as to perform evaporative cooling of the outside air, and supplies the outside air to the inside of the server room. However, when a temperature of outside air is lower than or equal to 25 degrees C.°, the server room cooling apparatus may cool the inside of the server room using only the outside air, without spraying mist on the outside air. Also, when a temperature of outside air is partially changed to be higher than or equal to 29 degrees C.°, the server room cooling apparatus may spray mist, and simultaneously, may operate a cooling coil so as to supply a relatively cooler air to the inside of the server room. When a temperature of outside air is maintained to be higher than or equal to 29 degrees C.°, the server room cooling apparatus may spray mist so as to perform evaporative cooling of the outside air, and simultaneously, operates the thermostat 610.

A temperature of outside air is low during the winter season and thus, the server room cooling apparatus may operate based on humidity. For example, when the humidity is lower than or equal to a predetermined (or desired) value, the server room cooling apparatus may mix outside air and an indoor air, may spray the mist on the mixed air and thus, may maintain a temperature and humidity of the inside of the server room to be a moderate condition. However, when the humidity is higher than the predetermined (or desired) value, the server room cooling apparatus may supply the mix of the outside air and the indoor air without spraying the mist on the mixed air.

As described in the foregoing, the server room cooling apparatus according to example embodiments may be solely operated based on a temperature and humidity of outside air, or may be operated in parallel with a thermostat and thus, may reduce or minimize an effect on an entire operation environment when one of the devices has a problem.

Figure 7:
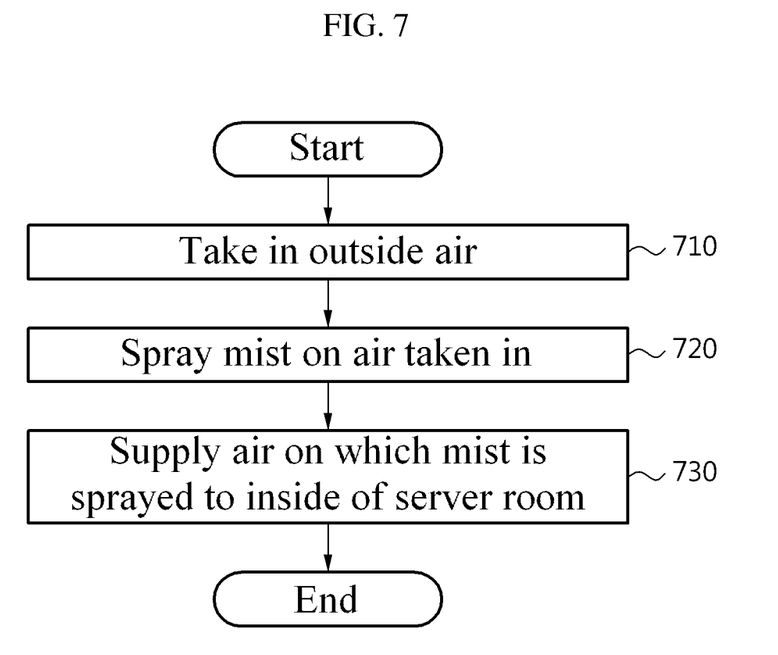
FIG. 7 is a flowchart illustrating a server room cooling method according to an example embodiment.

FIG. 7 is a flowchart illustrating a server room cooling method according to example embodiments.

The server room cooling method according to example embodiments may be applied to a place that needs to be cooled such as a data center and may perpetually or continuously cool the inside of a server room using air at a low cost even in an environment that varies based on temperature and/or humidity.

To achieve the above, the method takes in outside air from the outside of the server room, such as, the outside of a building. Generally, a foreign substance such as dust may be included in outside air and the foreign substance causes an error in a server, a network device, an enterprise device, and the like included in the server room. Accordingly, the foreign substance may be blocked using a filter when the outside air is taken in.

The filter may be embodied as a dual-filter to effectively remove a foreign substance included in outside air. The dual-filter may include, for example, a pre-processing filter that primarily blocks a foreign substance included in outside air and a roll filter that is automatically replaced based on a pollution level of the filter.

When the outside air of which the foreign substance is blocked flows into the server room cooling apparatus, the server room cooling apparatus sprays minute particles of water, for example, the mist, on the outside air using a nozzle in operation 720, so that a temperature and humidity of the inside of the server room is maintained to be a moderate condition. By way of example, when the mist is sprayed on the outside air taken into the server room cooling apparatus, a low humidity of the outside air which is a characteristic of outside air may increase and a temperature of the outside air may decrease.

The filter may be embodied as a dual-filter to effectively remove a foreign substance included in outside air. The dual-filter may include, for example, a pre-processing filter that primarily blocks a foreign substance included in outside air and a roll filter that is automatically replaced based on a pollution level of the filter.

The cooler air supplied to the server room may be changed to a warmer air by passing through a plurality of servers included in the server rack. Therefore, a duct that exhausts air from the inside of the server room may be provided in an upper portion of the server room. In this example, an air vortex may occur in the upper portion of the server room and thus, a baffle may be provided in an upper side of the server rack so as to reduce or prevent the air vortex.

The warmer air exhausted through the duct may flow again into the server room cooling apparatus so as to be cooled, or may be used for heating of a building or for clearing snow from roads around the building.

On one side of the server room cooling apparatus, a sensor that measures a temperature and humidity of outside air taken in from the outside of a building may be included. Information associated with the temperature and humidity of the outside air measured in the sensor may be transmitted to a controller.

The controller may cool or humidify the outside air by adjusting an amount of the mist sprayed, based on the information associated with the temperature and humidity of the outside air measured in the sensor, so that the outside air taken into the server room cooling apparatus has moderate temperature and/or humidity.

For example, the controller may adjust, based on a constant enthalpy line, an amount of the mist sprayed so as to lower a temperature of outside air when it is determined that the inside of the server room needs to be cooled by comparing information associated with a temperature/humidity of the inside of the server room and information associated with a temperature/humidify of outside air. The controller may adjust, based on a constant temperature line, an amount of the mist sprayed so as to raise the humidity of outside air supplied into the inside of the server room when the inside of the server room has a moderate temperature but it is determined that the inside of the server room needs to be humidified.

The server room cooling apparatus may include a thermostat that takes in air from the inside of the server room and cools the air. In this example, the controller controls the server room cooling apparatus to be solely operated based on a temperature and the humidity of outside air, or to be operated in parallel with a thermostat, so as to minimize an effect on an entire operation environment when one device fails to operate normally.

Also, the server room cooling apparatus takes in air from the inside of the server room based on a control of the controller and feeds the air into the server room cooling apparatus so that the mist may be sprayed to the air and thus, the server room is efficiently cooled or humidified.

It will be apparent to those skilled in the art that various modifications and variation can be made to example embodiments without departing from the spirit or scope of the invention. Thus, it is intended that the present invention cover the modifications and variations of these example embodiments provided they come within the scope of the appended claims and their equivalents.

What is claimed is:

1. A server room cooling apparatus, the apparatus comprising:
   an inlet part configured to take in outside air;
   a spray part configured to spray a mist on the outside air taken in by the inlet part;
   a supplying part configured to supply, to the inside of a server room, the outside air on which the mist is sprayed;
   a constant temperature part configured to take in return air from the inside of the server room and to cool the air;
   a plurality of damper motors; and
   a controller configured to select one of a first path and a second path by selectively opening and closing the plurality of damper motors, the first path configured to supply the outside air taken in by the spray part through the inlet part to the inside of the server room through the supplying part, and the second path configured to resupply the air taken in by the constant temperature part from the inside of the server room through the constant temperature part, without going through the spray part, and returned into the server room.

2. The apparatus of claim 1, wherein the inlet comprises a pre-processing filter configured to block a foreign substance included in the outside air taken in, and a roll-filter configured to be automatically replaced based on a pollution level of the roll-filter.

3. The apparatus of claim 1, wherein the supplying part is provided in a lower portion of the server room, and configured to supply the outside air on which the mist is sprayed to a server rack that is included in the server room.

4. The apparatus of claim 1, further comprising:
at least one sensor configured to measure temperature and humidity of the outside air taken in by the inlet part.

5. The apparatus of claim 1, wherein the controller is further configured to:
adjust an amount of the mist sprayed, so as to cool or to humidify the outside air taken in, based on a measured temperature and measured humidity of the outside air.

6. The apparatus of claim 5, wherein the controller is configured to adjust, based on a constant enthalpy line, an amount of the mist sprayed to lower the temperature of the outside air taken in.

7. The apparatus of claim 5, wherein the controller is configured to adjust, based on a constant temperature line, an amount of the mist sprayed to raise the humidity of the outside air taken in.

8. The apparatus of claim 1, wherein
the controller is further configured to operate the constant temperature part based on a temperature and humidity of the outside air to cool the air inside the server room.

9. The apparatus of claim 1, further comprising:
an intake part configured to take in air from the inside of the server room; and
the spray part is configured to spray the mist on outside air that is mixed with the taken in air from the inside of the server room.

10. The apparatus of claim 1, further comprising an exhaust part provided in an upper portion of the server room and is configured to exhaust air from the inside of the server room.

11. The apparatus of claim 10, wherein the exhaust part includes a baffle provided on an upper side of a server rack included in the server room.

12. A method for a server room cooling apparatus to cool a server room, the method comprising:
taking in outside air using an inlet part;
spraying a mist on the outside air taken in by a spray part; and
supplying the outside air on which the mist is sprayed to the inside of the server room through a constant temperature part;
cooling, by the constant temperature part, the return air supplied to the constant temperature part;
selecting, using a controller, one of a first path and a second path by selectively opening and closing a plurality of damper motors,
the first path configured to supply the outside air taken in by the spray part through the inlet part to the inside of the server room through the supplying part, and
the second path configured to resupply the air taken in by the constant temperature part from the inside of the server room through the constant temperature part, without going through the spray part, and returned into the server room.

13. The method of claim 12, wherein the taking in comprises:
taking in the outside air through a pre-processing filter configured to block a foreign substance included in the outside air, and
a roll-filter configured to be automatically replaced based on a pollution level.

14. The method of claim 12, wherein the supplying the outside air comprises:
supplying the outside air on which the mist is sprayed to a server rack included in the server room.

15. The method of claim 12, further comprising:
measuring temperature and humidity of the outside air taken in.

16. The method of claim 12, further comprising:
adjusting an amount of mist sprayed, based on a temperature and humidity of the outside air, so as to cool or to humidify the outside air taken in.

17. The method of claim 16, wherein the adjusting comprises:
adjusting an amount of mist sprayed, based on at least one of a constant enthalpy line and a constant temperature line, so as to lower the temperature or to raise the humidity of the outside air taken in.

18. The method of claim 12, further comprising:
cooling air of the inside of the server room by controlling a thermostat that takes in the air from the inside of the server room and cools the air, based on a temperature or humidity of the outside air.

19. The method of claim 12, further comprising:
taking in air from the inside of the server room; and
spraying the mist on outside air that is mixed with the air taken in.

20. The method of claim 12, further comprising:
reducing an air vortex using a baffle provided in an upper side of a server rack included in the server room; and
exhausting the air from the inside of the server room through a duct installed in an upper portion of the server room.

* * * * *